(12) United States Patent
Evans et al.

(10) Patent No.: US 12,355,299 B2
(45) Date of Patent: Jul. 8, 2025

(54) POWER DISCONNECT SYSTEM AND METHOD

(71) Applicant: Tesla, Inc., Austin, TX (US)

(72) Inventors: Kyle Breuning Evans, Auburn, CA (US); Adam Lydecker, Mountain View, CA (US); Alexey Nikolaev, Palo Alto, CA (US)

(73) Assignee: Tesla, Inc., Austin, TX (US)

( * ) Notice: Subject to any disclaimer, the term of this patent is extended or adjusted under 35 U.S.C. 154(b) by 300 days.

(21) Appl. No.: 18/024,957

(22) PCT Filed: Sep. 8, 2021

(86) PCT No.: PCT/US2021/049433
§ 371 (c)(1),
(2) Date: Mar. 6, 2023

(87) PCT Pub. No.: WO2022/055975
PCT Pub. Date: Mar. 17, 2022

(65) Prior Publication Data
US 2023/0246479 A1 Aug. 3, 2023

Related U.S. Application Data

(60) Provisional application No. 63/076,297, filed on Sep. 9, 2020.

(51) Int. Cl.
H02J 9/06 (2006.01)
G01R 15/18 (2006.01)
(Continued)

(52) U.S. Cl.
CPC ............ *H02J 9/062* (2013.01); *G01R 15/181* (2013.01); *H01H 71/02* (2013.01); *H01H 71/08* (2013.01);
(Continued)

(58) Field of Classification Search
CPC ................. H02J 9/062; H02J 13/00002; H02J 13/00006; H02J 2300/22; H02J 13/0004;
(Continued)

(56) References Cited

U.S. PATENT DOCUMENTS 4,977,482 A * 12/1990 Langdon ................ G01R 11/04
324/156
5,033,973 A * 7/1991 Pruehs ................... H01R 29/00
439/167
(Continued)

OTHER PUBLICATIONS

International Search Report and Written Opinion for International Application No. CT/US2021/049433, Notification mailed Dec. 8, 2021.

*Primary Examiner* — Rexford N Barnie
*Assistant Examiner* — Thai H Tran
(74) *Attorney, Agent, or Firm* — Knobbe, Martens, Olson & Bear, LLP

(57) ABSTRACT

The systems and methods herein described isolating a circuit breaker panel for a building from a grid circuit during an event disrupting the grid circuit. In one aspect, an interrupt switch system comprises a housing configured to mate with an electric meter socket on a first side and an electric meter on a second side, the housing comprising power inputs from grid power and power outputs to a circuit breaker panel and an interrupt circuit disposed within the housing and configured to interrupt a flow of electricity from the power inputs to the power outputs.

17 Claims, 7 Drawing Sheets

(51) Int. Cl.
*H01H 71/02* (2006.01)
*H01H 71/08* (2006.01)
*H02J 13/00* (2006.01)

(52) U.S. Cl.
CPC .. *H02J 13/00002* (2020.01); *H02J 13/00006* (2020.01); *H02J 2300/22* (2020.01)

(58) Field of Classification Search
CPC .... H02J 9/04; H02J 13/00004; G01R 15/181; G01R 22/065; G01R 11/04; H01H 71/02; H01H 71/08; H01H 50/02; H01H 2300/018; H01H 2300/03; G01D 4/004
See application file for complete search history.

(56) References Cited

U.S. PATENT DOCUMENTS

| | | | | |
|---|---|---|---|---|
| 5,546,269 | A * | 8/1996 | Robinson | H02B 1/03 324/156 |
| 5,572,396 | A * | 11/1996 | Robinson | G01R 1/36 361/127 |
| 6,104,586 | A * | 8/2000 | Robinson | H01H 83/20 361/663 |
| 2002/0075622 | A1* | 6/2002 | Robinson | H02B 1/03 361/127 |
| 2004/0000900 | A1* | 1/2004 | Loy | G01R 22/065 324/142 |
| 2005/0134430 | A1* | 6/2005 | French | H04M 11/022 700/286 |
| 2006/0055513 | A1* | 3/2006 | French | H02J 3/14 340/7.1 |
| 2008/0180885 | A1* | 7/2008 | Loehr | G01R 11/04 361/663 |
| 2010/0003848 | A1* | 1/2010 | Scott | H01R 9/2491 29/729 |
| 2010/0218798 | A1* | 9/2010 | Cinnamon | B60L 53/14 136/244 |
| 2011/0237118 | A1* | 9/2011 | Feldman | H01R 33/945 439/517 |
| 2012/0126793 | A1* | 5/2012 | Loy | G01R 22/063 324/142 |
| 2012/0326518 | A1* | 12/2012 | Rusch | H02J 9/062 307/80 |
| 2013/0123997 | A1* | 5/2013 | King | H02H 3/46 700/292 |
| 2013/0241532 | A1 | 9/2013 | Voisine et al. | |
| 2013/0269181 | A1* | 10/2013 | McBride | H02S 40/00 52/745.21 |
| 2013/0279049 | A1 | 10/2013 | Van Fossen et al. | |
| 2014/0098470 | A1 | 4/2014 | Robinson et al. | |
| 2014/0127935 | A1* | 5/2014 | Scott | H01R 33/945 439/517 |
| 2014/0218010 | A1* | 8/2014 | Fulton | G01R 22/065 324/110 |
| 2015/0036267 | A1* | 2/2015 | Miller | H02B 1/24 361/625 |
| 2015/0061644 | A1* | 3/2015 | Parks | G01R 1/0408 324/126 |
| 2015/0309075 | A1* | 10/2015 | Parks | G01R 1/0416 324/126 |
| 2016/0181752 | A1* | 6/2016 | Parks | G06Q 30/0201 439/517 |
| 2016/0236634 | A1* | 8/2016 | Parks | B60L 53/63 |
| 2016/0238633 | A1* | 8/2016 | Parks | G06Q 50/06 |
| 2016/0370830 | A1 | 12/2016 | Miller | |
| 2016/0380413 | A1* | 12/2016 | Cruz | H02H 7/22 361/668 |
| 2017/0082674 | A1 | 3/2017 | Lawton et al. | |
| 2018/0131166 | A1 | 5/2018 | Emert et al. | |
| 2019/0081458 | A1* | 3/2019 | Lapushner | H02J 9/06 |
| 2019/0356127 | A1 | 11/2019 | Ostrovsky et al. | |
| 2020/0153208 | A1* | 5/2020 | Miller | H02B 1/30 |
| 2020/0259336 | A1 | 8/2020 | Rao et al. | |
| 2021/0006073 | A1* | 1/2021 | Donahue | H02J 3/32 |
| 2021/0098994 | A1* | 4/2021 | White | H02J 7/02 |
| 2021/0109142 | A1* | 4/2021 | Karlgaard | G01R 11/04 |
| 2021/0276442 | A1* | 9/2021 | Schroeder | B60L 55/00 |
| 2022/0311197 | A1* | 9/2022 | Ferree | B60L 53/16 |
| 2023/0028679 | A1* | 1/2023 | Fulton | H01R 31/065 |
| 2023/0148230 | A1* | 5/2023 | Schroeder | H02H 3/083 361/87 |
| 2023/0246479 | A1* | 8/2023 | Evans | H01H 71/02 307/65 |
| 2024/0006882 | A1* | 1/2024 | Donahue | H02J 3/001 |
| 2024/0359574 | A1* | 10/2024 | Schroeder | B60L 53/62 |
| 2024/0429717 | A1* | 12/2024 | Schroeder | H02J 13/00002 |
| 2025/0030249 | A1* | 1/2025 | Schroeder | H02J 13/00004 |

\* cited by examiner

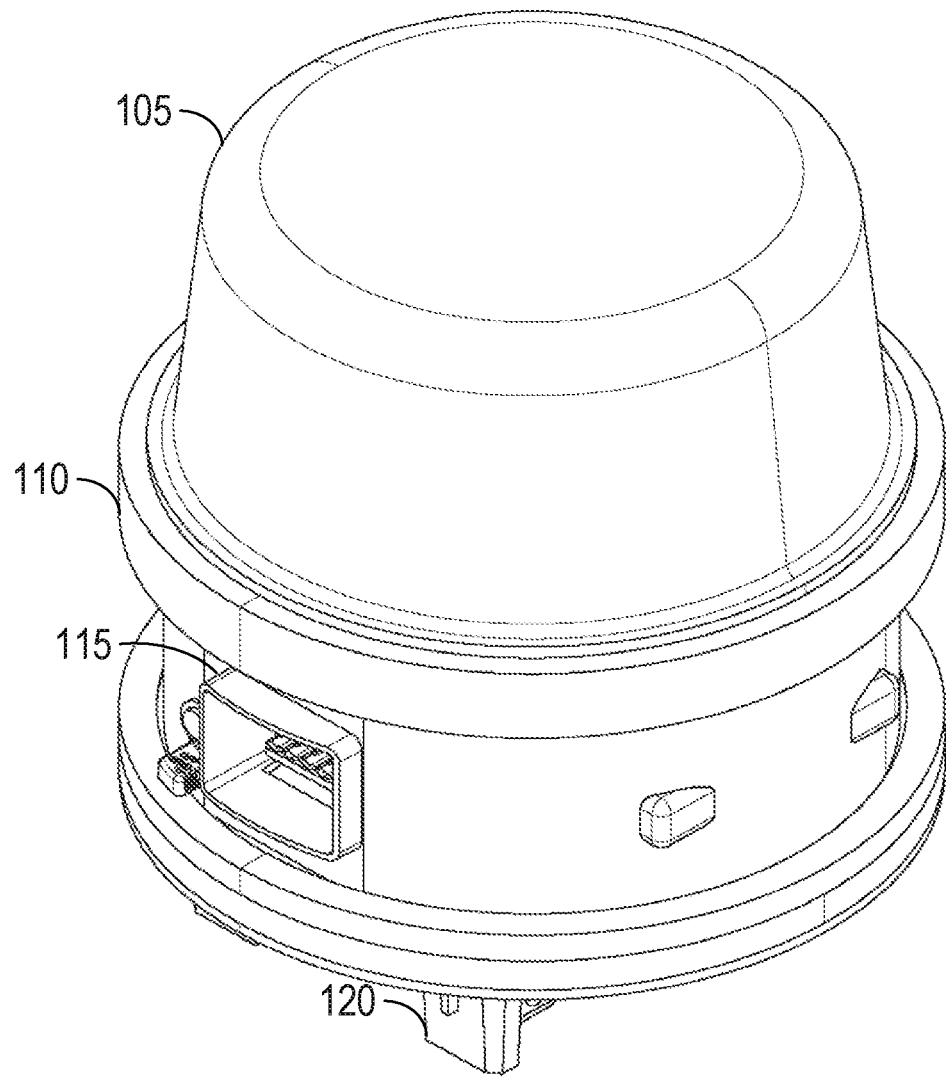
FIGURE
1A

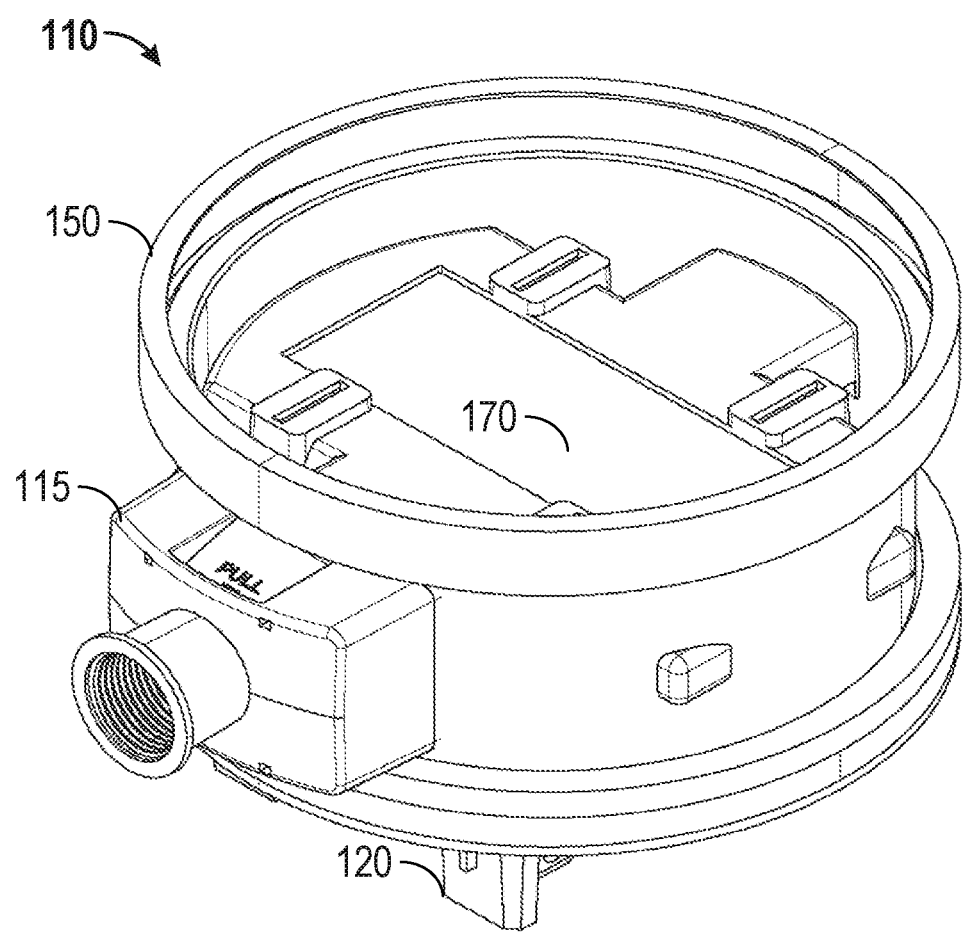
FIGURE
1B

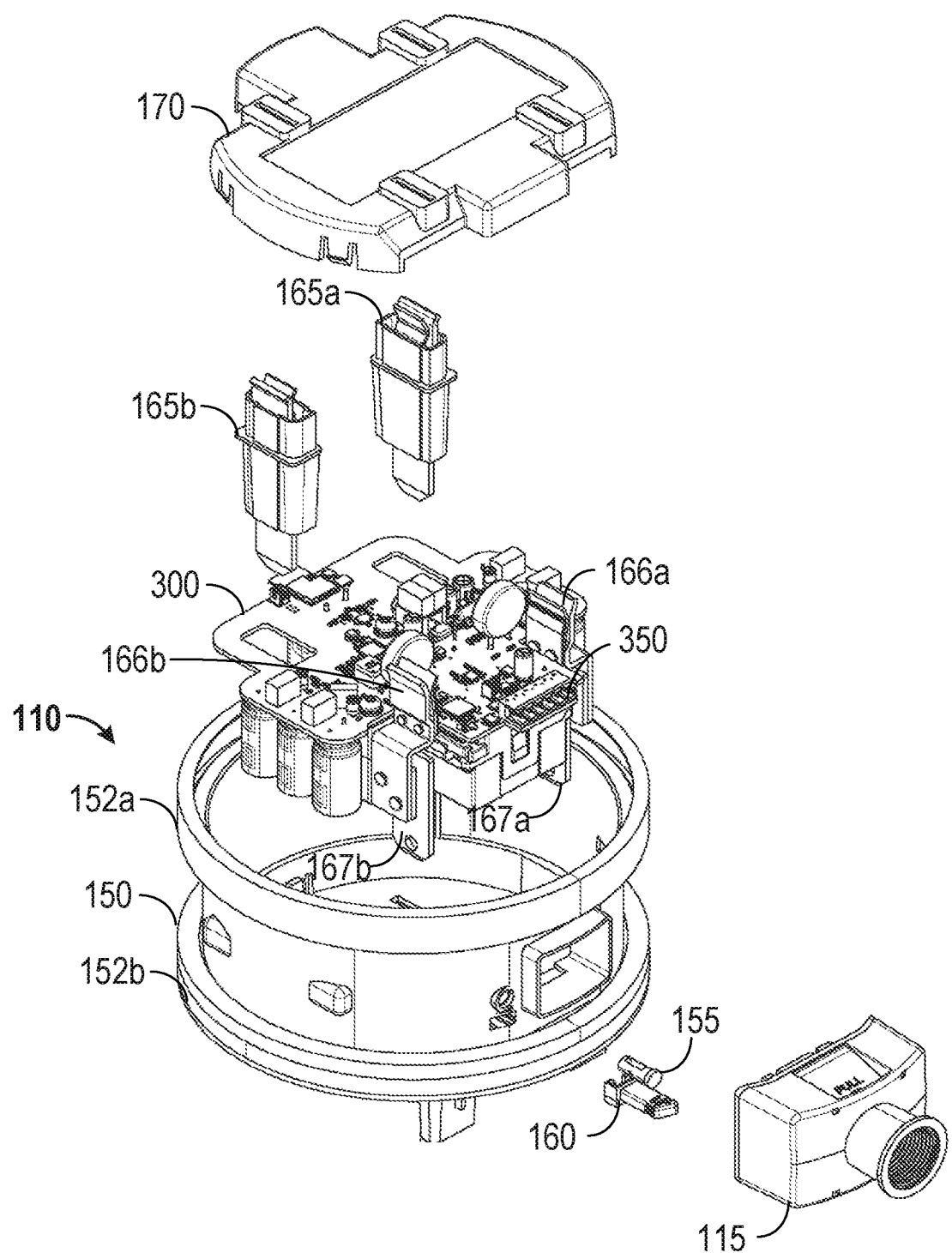
FIGURE
1C

POWER DISCONNECT SYSTEM AND METHOD

CROSS-REFERENCE TO RELATED APPLICATIONS

This application is a U.S. national stage application of International Patent Application No. PCT/US2021/049433, filed Sep. 8, 2021, which claims the benefit of U.S. Provisional Application No. 63/076,286, filed Sep. 9, 2020, the disclosure of each of which is hereby incorporated by reference in its entirety.

FIELD

This disclosure relates generally to isolation point switches for building power connections, and more specifically, to incoming power meter isolation/backup switches for residential, single-family home power connections.

BACKGROUND

Residential buildings are connected to the power grid through a power meter that measures consumption of electricity by all of the electronic devices associated with or powered inside of the building. Some residential buildings may have additional electricity sources, for example a backup generator, battery, or solar power array. For safety reasons, these additional electricity sources must be disconnected from the power grid if main power from the grid is interrupted. For example, if there is a power failure at the grid, the additional electricity sources should not be allowed to backfeed electricity to the grid. Doing so could injure workers repairing the power grid.

Various systems, such as Automatic Transfer Switches, exist that automatically disconnect the electrical feed from the power grid to a residential building when main power is interrupted. These systems may also enable use of the additional electricity sources to supplement or replace the electrical feed from the grid or provide backup power when the electrical feed from the grid fails. However, providing power to all of the circuits of a residential building during such a power failure can be problematic.

SUMMARY

For purposes of summarizing, certain aspects, advantages, and novel features have been described herein. It is to be understood that not all such advantages may be achieved in accordance with any one particular embodiment. Thus, the disclosed subject matter may be embodied or carried out in a manner that achieves or optimizes one advantage or group of advantages without achieving all advantages as may be taught or suggested herein.

In one aspect, an interrupt switch system is disclosed. The interrupt switch system comprises a housing configured to mate with an electric meter socket on a first side and an electric meter on a second side, the housing comprising power inputs from grid power and power outputs to a circuit breaker panel and an interrupt circuit disposed within the housing and configured to interrupt a flow of electricity from the power inputs to the power outputs.

In some embodiments, the housing further comprises a first conductor pair configured to electrically couple input terminals of the electric meter to respective terminals in the electric meter socket, a second conductor pair configured to electrically couple output terminals of the electric meter to the power inputs, and a third conductor pair configured to couple the power outputs to respective terminals in the electric meter socket electrically coupled to the circuit breaker panel. In some embodiments, the first conductor pair, the second conductor pair, and the third conductor pair are at least partially disposed within the housing. In some embodiments, the system further comprises a communication circuit in data communication with the interrupt circuit and configured to communicate one or more of a heartbeat signal and a state of the grid power to an external component. In some embodiments, the external component is a power backup system configured to provide power to the circuit breaker panel in a backup event. In some embodiments, the power backup system is one of a battery backup device and a solar power array. In some embodiments, the system further comprises a sense circuit configured to sense power flow into the electric meter and a processor circuit configured determine the state of the grid power based on the sensed power flow. In some embodiments, the sense circuit comprises at least one Rogowski coil configured to sense power flow through a bus bar pair that feeds the grid power to the electric meter. In some embodiments, the housing is an ANSI 2S compliant adapter configured to receive the electric meter that is ANSI 2S compliant on the second side and mate with the electric meter socket that is ANSI 2S compliant on the first side. In some embodiments, the housing comprises a manual disconnect switch configured to interrupt the flow of electricity from the power inputs to the power outputs when the manual disconnect switch is actuated.

In one aspect, a method of isolating a circuit breaker panel for a building from a grid circuit during an event disrupting the grid circuit is disclosed. The method comprises sensing a current in the grid circuit and transitioning to backup power based on detecting a disruption in the grid circuit. The transitioning comprises disconnecting output terminals of an electric meter for the building from terminals of an electric meter socket via which the circuit breaker panel receives electricity from the grid circuit using an interrupt switch adapter, wherein the interrupt switch adapter is installed into the electric meter socket and the electric meter is installed into the interrupt switch adapter and activating a backup power source to energize at least a portion of the circuit breaker panel during the disruption in the grid circuit.

In some embodiments, sensing a current in the grid circuit comprises sensing the current in the grid circuit with at least one Rogowski coil without physically contacting the grid circuit and without establishing communications with the grid circuit. In some embodiments, the method further comprises continuously monitoring the grid circuit for an end of the disruption and connecting the circuit breaker panel to the grid circuit when a first power quality of the gird circuit and a second power quality of the backup power source are substantially similar. In some embodiments, the method further comprises detecting the end of the disruption, detecting a parameter of the first power quality, detecting a parameter of the second power quality, communicating the parameter of the first power quality to the backup power source, and determining that the parameter of the first power quality and the parameter of the second power quality are substantially similar before connecting the grid circuit to the circuit breaker panel. In some embodiments, the method further comprises detecting that the grid circuit is experiencing the disruption based on sensing the current in the grid circuit. In some embodiments, transitioning to backup power further comprises confirming that the backup power source is available to provide power to at least the portion of the circuit breaker panel and maintaining a heartbeat with the backup power source.

The details of one or more variations of the subject matter described herein are set forth in the accompanying drawings and the description below. Other features and advantages of the subject matter described herein will be apparent from the description and drawings, and from the claims. The disclosed subject matter is not, however, limited to any particular embodiment disclosed.

BRIEF DESCRIPTION OF THE DRAWINGS

The aspects described herein, as well as other features, aspects, and advantages of the present technology will now be described in connection with various implementations, with reference to the accompanying drawings. The illustrated implementations, however, are merely examples and are not intended to be limiting. Throughout the drawings, similar symbols typically identify similar components, unless context dictates otherwise. Note that the relative dimensions of the following figures may not be drawn to scale.

FIG. 1A is a perspective view of a combination power meter and interrupt switch system configured to enable automatic and dynamic transition between an isolation mode and a connected mode.

FIG. 1B is a perspective view of the interrupt switch system of FIG. 1A.

FIG. 1C is an exploded perspective view of the interrupt switch system of FIG. 1B.

DETAILED DESCRIPTION

Figure 2:
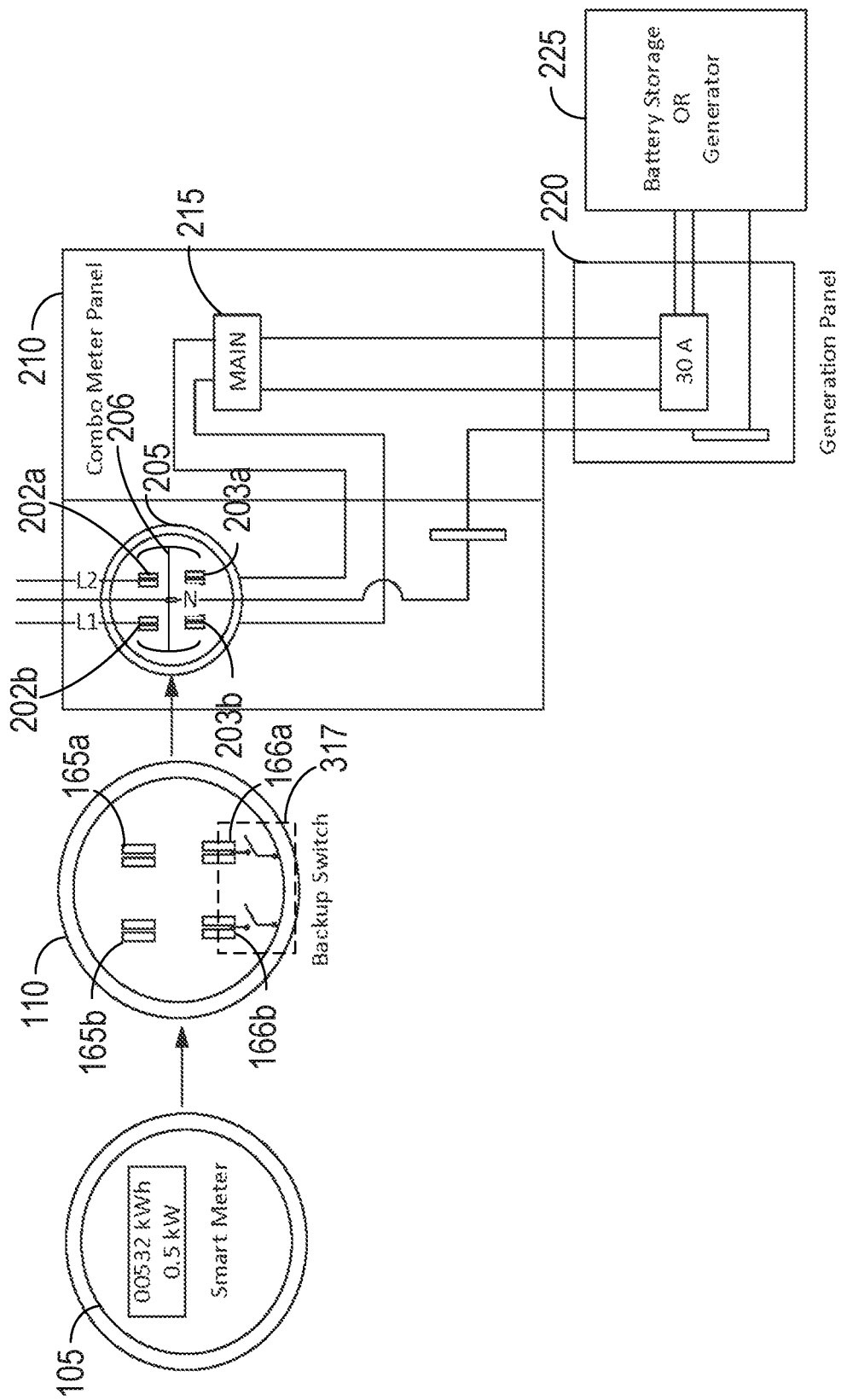
FIG. 2 is a schematic of an example implementation of the combination power meter and interrupt switch system of FIG. 1A in connection with the building circuit breaker panel.

Most buildings, for example residential, single-family homes, receive electricity from a power utility or supplier via a power grid that connects many homes to one or more sources of electricity. The buildings may use the electricity to power or charge various loads via a building circuit, including lighting, environmental control equipment, electric vehicle (EVs), appliances, and any other loads powered by electricity. The building circuit generally includes a circuit breaker panel that receives electricity at input terminals and supplies the received electricity to one or more sub-circuits via circuit breakers. For example, the power outlets or lights in each room in the building may include its own sub-circuit controlled by a respective circuit breaker. The circuit breaker panel generally receives electricity from the power grid through input terminals. Those input terminals are connected to a power meter which is used by the power utility to measure energy consumption (i.e., power used over a period of time) at or in the building. The electricity from the power meter is then fed through the circuit breaker panel to each circuit in the building.

In some embodiments, the building that receives electricity via the power grid also has its own additional electricity source that is connected directly to the building. The additional electricity sourced may be a solar array, battery, or generator that can act as a backup electricity source ("backup source") to provide power to the electrical loads within the building in the event of a disruption of power to the building. The backup source and the power grid may be integrated and connected with the building circuits such that either, both, or neither of the backup source and the power grid can provide electricity to the building circuit (and its loads) at any given moment.

However, integrating and connecting the power grid with the building circuit and the backup source may be complicated and expensive, especially when the integration is a retrofit or modification after construction of the building is complete. For example, isolation circuitry must be located between the backup source and the power grid to avoid supplying electricity from the backup source to the power grid when the power grid is not providing electricity to the house. This provides a safety mechanism so that someone accessing or working on the power grid when it is down (i.e., not supplying electricity) cannot receive a shock from the electricity generated by the backup source. Additionally, the isolation circuitry may enable electricity to flow bidirectionally between the power grid and the backup source as appropriate, enabling the building to source electricity from the backup source when available, supplement the electricity from the backup source with the electricity from the power grid when needed, and provide electricity from the backup source to the power grid when excess electricity is available.

In some instances, the building circuit includes a gateway or similar device that provides electronic monitoring and/or communications between various components (for example, the backup source, the building circuit, the power grid, and a building control system). In some instances, the gateway integrates with or includes the isolation circuitry and/or provides an electrical isolation point for islanding or separating the building from the power grid. The isolation point must be electrically located between a power meter, where the power grid may be connected to the building circuit, and any load or backup source of the building circuit. The power utility may not allow any connections to the power grid upstream or before the power meter to ensure that no one is able to access free electricity. However, introducing the isolation circuitry between the power meter and the building circuit may be costly and difficult to complete.

As described above, introducing the isolation circuitry between the power meter and the building circuit breaker panel is difficult and costly to do. For example, in many buildings, the power meters is installed or integrated with the circuit breaker panel, which many minimize or eliminate available locations between the building circuit breaker and power meter at which the isolation circuitry can be introduced. For example, on average, buildings that use a meter-load center combo panel, which may represent ~70% of CA homes), 20+ loads or sub-circuits have to be relocated from the building circuit breaker panel to a new subpanel that includes separate, backup loads. Relocating the loads or sub-circuits is a time-consuming and expensive process that adds to the direct installation cost that, thus, increases costs for introducing or retrofitting backup sources into an existing building.

One embodiment of the invention is a power disconnect system that provides isolation circuitry disposed between the input connections from the power grid and the power meter. By placing isolation circuitry between the power meter and a main power input for the building the system can disconnect the main power from the entire circuit breaker panel. In one embodiment, the power disconnect system is an adapter the plugs into the power meter socket on one side and accepts the power meter on the other side. Thus, installation of the isolation circuitry may merely require extracting the power meter from the power meter box, inserting the adapter having isolation circuitry into the power meter socket, and then inserting the power meter into the isolation circuitry. In addition to the installation savings, introducing the isolation circuitry between the main power input and the power meter enables various features previously unavailable.

One such feature includes improved monitoring capabilities of the power grid, for example detection of when the power grid is experiencing a disruption or similar event, monitoring of one or more parameters of power quality of the power grid, and so forth. An additional feature includes improved automatic and dynamic transitioning between an isolation mode (where the building is isolated from the power grid and powered by the backup source) and a connected mode (where the building is connected to the power grid and powered by one or both of the power grid and the backup source). Further details of the components and operation of the isolation circuitry that produce the features and savings described herein are provided below.

The foregoing aspects and many of the attendant advantages of this disclosure will become more readily appreciated as the same become better understood by reference to the following description, when taken in conjunction with the accompanying drawings.

FIG. 1A is a perspective view of a combination power meter 105 and interrupt switch system 110 configured to enable automatic and dynamic transition between an isolation mode and a connected mode. The components of power meter 105 may be combined with an enclosure cover that encloses at least a portion of the power meter 105 components or the power meter 105 may be considered as the components as described herein. In some embodiments, the power meter 105 comprises any residential or other power meter having a standard alternating current voltage (for example, a 240/120 split phase VAC for residential buildings or 120/208 wye VAC for commercial buildings). The power meter 105 may be embodied into one or more shapes, sizes or configurations for utilization in residential embodiment, commercial embodiments, etc. For example the power meter 105 (including the enclosure) can conform to one or more ANSI form meter socket standards such as the 2S ANSI form meter socket and so forth. The power meter 105 may enable the power utility to measure power or energy consumed at the building and, in some embodiments, communicate with the building circuit and devices connected thereto. The interrupt switch system 110 may conform to the same standards as the power meter 105 to act as an adapter and also maintain cross-operability with the power meter 105. For example, since the interrupt switch system 110 will be positioned between the power meter 105 and the power meter socket (not shown in FIG. 1A), the interrupt switch system 110 will have similar voltage signal requirements to maintain operability with components of the power meter 105. Similarly, the interrupt switch system 110 will have similar physical parameters and form factor constraints to ensure that the power meter 105 can connect to the interrupt switch system 110 without modification of the power meter 105 (or a minimal modification) and that the interrupt switch system 110 will connect to the power meter socket without modification of the power meter socket.

The interrupt switch system 110 may be further configured such that its dimensions, weight distribution, and so forth do not cause one or both of the interrupt switch system 110 and the power meter 105 to fall out of the power meter socket. In some embodiments, when the power meter 105 is covered by the enclosure cover on the interrupt switch system 110, the enclosure cover is removable.

The interrupt switch system 110 includes a removable terminal cover 115. The terminal cover 115 may shield an electrical communications connector, a manual override switch, and a reset switch (none shown in this figure) from environmental conditions and accidental contact and actuation. The electrical communications connector may allow the interrupt switch system 110 to communicate with one or more other devices in the building circuit and/or the backup source. The manual override switch may enable a user or other entity to manually for the interrupt switch system 110 into an interrupt or isolating mode. The reset switch may enable the user or other entity to manually reset the interrupt switch system 110 from the isolating mode to the connected mode. These components will be described in further detail below. Illustratively, the terminal cover 115 may be configured in a manner that facilitates connectivity with other components and secures the connector to the interrupt switch system 110. The terminal cover 115 may also be configured to absorb forces placed on the connector such to avoid pulling on the wires, conduit, etc.

The interrupt switch system 110 further comprises a plurality of prongs or conductors 120 that connect the interrupt switch system 110 to the power meter socket and pass power from the power meter 105 to the building circuit via the interrupt switch system 110. Though not clearly shown in FIG. 1A, the interrupt switch system 110 conforming to the 2S ANSI meter socket for residential voltages may include two pairs of prongs or conductors 120 (not all shown in FIG. 1A). One pair may correspond to the two input prongs 120 where the split phase voltage is received from the power grid and the other pair may correspond to the two output prongs 120 where the split phase voltage is provided to the building circuit. The pair of input prongs 120 may allow the input power from the power grid to feed directly to the power meter 105 while the pair of output prongs 120 allows the input power to flow from the power meter 105 through the interrupt switch system 110 (when the interrupt switch system 110 is in the connected mode, as described further below) and to the building circuit.

Providing further focus to the interrupt switch system 110, FIG. 1B is a perspective view of an interrupt switch system 110 as disclosed in FIG. 1A. The interrupt switch system 110 is shown without the power meter 105, enabling a view of components of the interrupt switch system 110. As shown, at least in part, the interrupt switch system 110 comprises an enclosure 150, an enclosure cover 170, and receptacles for prongs from the power meter 105. Further detail regarding these and other components of the interrupt switch system 110 is shown in FIG. 1C and described in the corresponding description below. One skilled in the relevant art will appreciate that the circular shape of the interrupt switch system would be complimentary with the shapes acceptable by the power meter 105 or power meter socket. Accordingly, such shape is illustrative in nature and one or more aspects of the present application may be embodied in different form factors.

FIG. 1C is an exploded perspective view of the interrupt switch system 110 of FIG. 1B. The interrupt switch system 110, as shown, comprises the enclosure 150, the reset switch 155, the manual override switch 160, the PCB 300, bus bars 165a-165b, bus bars 166a-166b, bus bars 167a-167b, the enclosure cover 170, and the terminal cover 115. Details regarding the structure and/or function of each of these components will be discussed below.

The enclosure 150 provides a portion of a housing or enclosure for the components identified above relative to the interrupt switch system 110. The enclosure 150 may have a size and shape relative to a corresponding meter socket size and/or shape and to maintain security and fit of use between the power meter 105 and the power meter socket. As shown, the enclosure 150 is generally round or circular in shape with a diameter to generally match the 2S ANSI meter socket for residential building applications. The enclosure 150 may comprise meter collars 152a-152b comprising various dimensions, shapes, configurations, lips, and so forth. The meter collars 152a-152b may ensure a secure and water and dust resistant or free connection between the power meter 105 and the enclosure 150 of the interrupt switch system 110 (for example, via the meter collar 152a) and the enclosure 150 and the power meter socket (for example, via the meter collar 152b). In some embodiments, the meter collars 152a-152b are separate components from the enclosure 150 and are used to mount/couple the power meter 105 to the enclosure 150 and/or mount/couple the enclosure 150 to the power meter socket.

The PCB 300 comprises the circuitry and corresponding electronic components that provide the various functions of the interrupt switch system 110 described herein. The components of the PCB 300 enable the interrupt switch system 110 to disconnect or interrupt a flow of electricity from the power meter 105 to the building circuit breaker panel, for example via a relay, a contactor, a circuit breaker, and so forth (hereinafter referred to as the "relay". When the relay is in an "open" condition or state, the relay may disconnect the power meter 105 from the building circuit breakers. When the relay is in a "closed" condition or state, the relay may connect the power meter 105 to the building circuits. Furthermore, the components of the PCB 300 provide input/output signals that enable the interrupt switch system 110 to communicate with one or more components of the building circuit or the backup source. In some embodiments, as described in more detail below, the interrupt switch system 110 may communicate via one or both of a wired or wireless connection (for example, via a Wi-Fi connection, a Bluetooth connection, an Ethernet connection, an RS-485 connection, a controller area network (CAN) bus connection, and so forth). Further details of the PCB 300 are explained with respect to FIG. 3 below. In some embodiments, additional components may be included as part of the components of the PCB 300. For example, one or more fans may be included at various locations within the PCB, such as adjacent to the bus bars, to provide additional cooling/heat dissipation functionality.

The components of the PCB 300 may interface with the reset switch 155 and/or the manual override switch 160 introduced above. For example, the manual override switch 160, when actuated, may cause the interrupt switch system 110 to interrupt the flow of electricity from the power meter 105 to the building circuits, i.e., cause the relay to open. For example, the user or homeowner may wish to manually switch from the connected mode to the isolated mode, for example during high cost periods for consuming energy from the power grid or when troublesome weather or events are expected that could cause disruptions in the delivery of the electricity to the building system. By actuating the manual override switch 160, the interrupt switch system 110 may cause the relay to open. The reset switch 155 may reset the actuation by the user or homeowner of the manual override switch 160, thereby closing the relay when all conditions support closing the relay (for example, that the power grid is active and supplying similar or matching conditioned electricity. Thus, when the manual override switch 160 causes the interrupt switch system 110 to transition from the connected mode to the isolated mode, actuation of the reset switch 155 may cause the interrupt switch system 110 to begin a transition from the isolated mode to the connected mode. However, the reset switch 155 may be subordinate to the automated and dynamic functions of the interrupt switch circuit 110. For example, actuation of the reset switch 155 may have no effect if the interrupt switch circuit 110 is in the isolated mode (thereby disconnecting or interrupting the electricity flow from the power meter 105 to the building circuit) from its own monitoring of the power grid and corresponding inputs. Thus, the reset switch 155 may only cause the interrupting switch system 110 to begin a transition from the isolated mode to the connected mode when the interrupting switch system 110 is only in the isolated mode due to actuation of the manual override switch 160.

As described above, the terminal cover 115 may cover the manual override switch 160 and the reset switch 155 to protect them from accidental actuation. The terminal cover 115 may also protect a connector 350 that connects the PCB 300 to one or more of the building circuit and the backup source. The terminal cover 115 may include a connection (for example, threaded) through which one or more conductors or cables can be fed, for example that terminate with the connector 350 at the PCB 300.

The bus bars 165a-165b, as noted above, provide for a direct connection of the input terminals of the power meter 105 to the corresponding terminals of the power meter socket that connect to the power grid. By providing this direction connection, the bus bars 165a-165b ensure that no electrical connections exist between the power meter and the power grid that enable unmetered power to be accessed, for example by the interrupting switch system 110. The bus bars 165a-165b pass through corresponding holes or slots 169a-169b in the PCB 300 and terminate with corresponding prongs 120 inserted into respective receptacles at the power meter socket (not shown). The bus bars 165a-165b may be insulated to ensure that no electrical connections are made to the bus bars 165a-165b while the bus bars 165a-165b pass through the interrupting switch system 110.

The bus bars 166a-166b provide the power from the power meter 105 to the PCB 300 and other components of the interrupting switch system 110, while the bus bars 167a-167b provide the power from the interrupting switch system 110 to the power meter socket and the building circuit, where the bus bars 167a-167b terminate in the respective prongs 120 that terminate into corresponding receptacles in the power meter socket.

The enclosure cover 170 may create a physical barrier between the power meter 105 and the components of the interrupt switch system 110. For example, the enclosure cover 170 may provide safety benefits by reducing accidental contact with the bus bars 165a-165b in the enclosure 150 and/or prevent prongs of the power meter 105 (that contact the bus bars 165a-165b and the bus bars 167a-167b) from contacting and/or damaging any of the components of the interrupt switch system 110 and/or the PCB 300.

Further details regarding the operation of and features of the interrupting switch system 110 are provided in relation to FIG. 3 below. FIG. 2, on the other hand, illustrates how the power meter 105 and the interrupting switch system 110 integrate with the circuit breaker panel of the building, the power grid, the backup source, and the building circuit. More specifically, FIG. 2 is a schematic of an example implementation of the combination power meter 105 and interrupt switch system 110 of FIG. 1A in connection with the building circuit breaker panel 210. As shown, the circuit breaker panel 210 in integrated with the power meter socket 205, which includes receptacles 202a-202b and 203a-203b for the prongs of the power meter 105 and/or the prongs 120 of the interrupting switch system 110. In some embodiments, the receptacles 202a-202b receive the prongs 120 of the bus bars 165a-165b that provide electricity from the power grid to the power meter 105 and the receptacles 203a-203b receive the prongs 120 of the bus bars 167a-167b that provide electricity from the interrupting switch system 110 to the circuit breaker panel 210. The power meter socket 205 may receive electricity to pass to the power meter 105 from a connection 201 with the power grid. As illustrated in FIG. 2, the power meter socket 205 can further incorporate some for spring contact 206 to facilitate the retention of the electrical connection.

The circuit breaker panel 210 may include a main circuit breaker 215 and the number of circuit breakers for sub-circuits of the building circuit (not shown in this figure). Electricity from the power meter socket 205 will pass through the main circuit breaker 215 and to the sub-circuits of the building circuit.

When an entity is installing the backup source 225 (for example, solar array, battery or fossil fuel-based generator) from an existing building, the entity may remove the power meter 105 from the power meter socket 205. To implement the features and benefits described herein, the entity may install the interrupting switch system 110 into the power meter socket 205 (such that the prongs 120 terminate in the receptacles 202a-202b and 203a-203b) and then install the power meter 105 into the interrupting switch system 110 (such that prongs of the power meter 105 terminate in receptacles of the bus bars 165a-165b and the bus bars 166a-166b). By installing the interrupting switch system 110 between the power meter 105 and the power meter socket 205, the interrupting switch system 110 enables isolation of the building circuit (via the circuit breaker panel 210), monitoring of the power grid via the connection 201, and communications between the components of the building circuit and the backup source. Furthermore, since the isolation point that can isolate the building circuit from the power grid exists upstream of the circuit breaker panel 210, no additional load or backup panel is needed. This enables the entity to install the backup source 225 directly to the circuit breaker panel 210. In some embodiments, the entity installs an optional generation panel 220 to provide convenient or code mandated local shutoff access for the backup source, but no loads or sub-circuits need to be relocated from the circuit breaker panel 210 to the generation panel 220 or any other subpanel. Though not shown in this figure, when the entity connects the backup source 225 to the circuit breaker panel 210, the backup source 225 is able to provide electricity to any of the sub-circuits of the building circuit or to the power grid.

Figure 3:
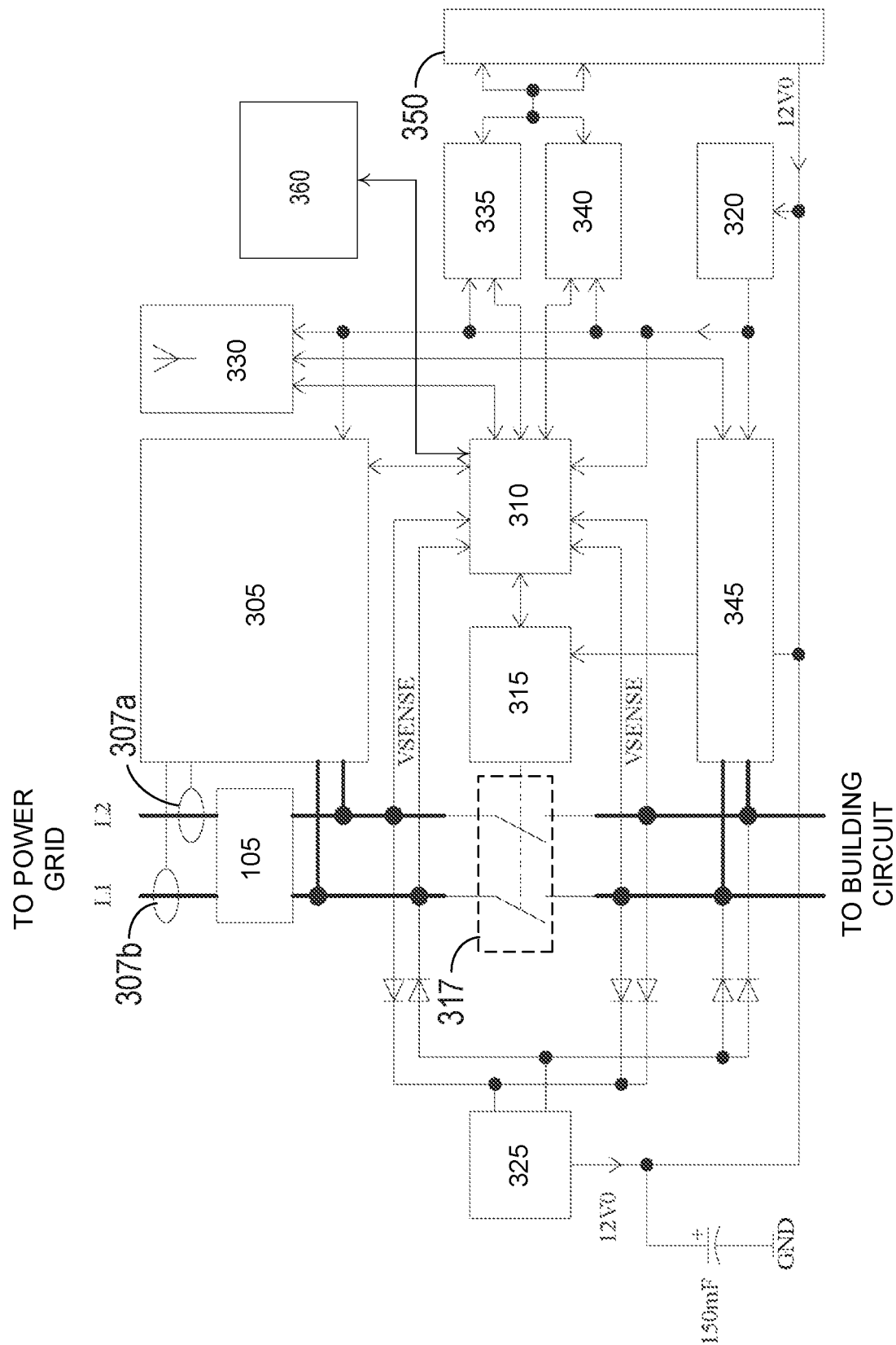
FIG. 3 is a block diagram of components of a printed circuit board (PCB) of the interrupt switch system.

Details of the functions and features of the components of the PCB 300, relative to the interrupting switch system 110, the power grid, and the backup source, are provided with reference to FIG. 3. FIG. 3 is a block diagram of components of the printed circuit board (PCB) 300 of the interrupt switch system 110. The PCB 300 includes various components installed thereon or affixed thereto. For example, the PCB 300 includes an energy meter 305, sense coils 307, a processor circuit 310, a relay driver circuit 315, the relay 317, a voltage regulator 320, a voltage converter 325, and one or more of a Wi-Fi communication module 330, an RS-485 communication module 335, a CAN bus communication module 340, and a power-line communication modem 345. In some embodiments, when the PCB 300 includes the RS-485 communication module 335 or the CAN bus communication module 340. Thus, the PCB 300 may include the connector 350 that connects to the PCB 300 and enables communications between the PCB 300 (and, thus, the interrupt switch system 110) and the backup supply 225 or the building circuit. For example, the connector 350 connects to a cable that passes through the connection of the terminal cover 115 to connect with external devices (for example, the backup source and/or the building circuit).

The energy meter 305 may use the sense coils 307 to sense or monitor conditions of the power grid. For example, the sense coils 307 comprise two sense coils 307a and 307b, with one of the two sense coils 307a-307b encircling one of the slots 169a-169b through which the bus bars 165a-165b pass, respectively. The sense coils 307a-307b may inductively measure one or more parameters of a signal passing through the bus bars 165a-165b, respectively. For example, the sense coils 307a-307b measure a current carried through the bus bars 165a-165b, respectively, where a voltage induced in the sense coils 307a-307b is proportional to a rate of change of the current in the bus bars 165a-165b, respectively. The sense coils 307a-307b may comprise Rogowski coils or other inductive sense coils. In some embodiments, the energy meter 305 receives the induced voltage(s) from the sense coils 307a-307b and uses these voltages to determine a condition of the power grid (for example, whether the power grid is providing electricity or experiencing a disruption). In some embodiments, the combination of the sense coils 307a-307b and the energy meter 305 may read one or more other parameters (aside from the current) of the signal passing through the bus bars 165a-165b, for example parameters that determine a quality of the electricity being provided by the power grid. In some embodiments, the energy meter 305 may obtain power from the electricity at the output of the power meter 105. The energy meter 305 may monitor that power to identify the one or more parameters of the quality of the power grid. In some embodiments, though not explicitly shown in FIG. 3, the energy meter 305 may sense quality and other characteristics of the power on the building circuit side of the power meter 105 (for example, via the bus bars 166a-166b and/or bus bars 167a-167b). The energy meter 305 may monitor that power to identify the one or more parameters of the quality of the power from the backup source or the building circuit. In some embodiments, information identified by the energy meter 305 may be communicated to the processor circuit 310.

The processor circuit 310 may receive various information from the components of the interrupting switch system 110 and external components (for example, the backup source and/or the building circuit). For example, the processor circuit 310 manages communications with the backup source and/or the building circuit via the Wi-Fi module 330, the RS-485 module 335, the CAN bus module 340, or the PLC modem 345. The processor circuit 310 may maintain a heartbeat signal with the backup source 325 and/or the building circuit to confirm that communications are still active between the interrupting switch system 110 and the backup source 325 and/or the building circuit.

Additionally, the processor circuit 310 controls operation of the relay driver 315, and thus the relay 317, based on the voltage sense information from a connection to the bus bars 166a-166b, information identified by the energy meter 305, and information received from the Wi-Fi module 330, RS-485 module 335, CAN bus module 340, and/or PLC modem 345. For example, the processor circuit 310 may determine that the power grid is not supplying power due to the monitoring information received from the energy meter 305 and the sense circuits 307. Based on this determination, the processor circuit 310 may cause the relay 317 to open, for example by sending an "open" signal or command to the relay driver 315. In advance of or concurrent with opening the relay 317 via the relay driver 315, the processor circuit 310 may communicate with the backup source to inform of the transition between the connected mode and the isolated mode. In some embodiments, the processor circuit 310 may send a "wake-up" or similar signal to the backup source to enable the backup source to be ready for an increased load. In some embodiments, since the processor circuit 310 is switching from the connected mode to the isolated mode, the transition for the building circuit may be seamless or invisible to the building circuit, especially when the backup source is capable of supporting an entirety of the building circuit. As described above, the open signal may be used to disconnect the power grid from the building circuit, for example during conditions when the power grid is not providing power, for various reasons, including the safety reasons discussed above.

Additionally, the processor circuit 310 may manage and control the transition from the isolated mode to the connected mode. The processor circuit 310 may determine to transition from the isolated mode to the connected mode based on a detection that the power grid is again providing power. The processor circuit 310 may also account for signals from the backup source 325 and/or the building circuit. For example, if the power grid is providing power and the backup source 325 is nearing exhausting its power supply, then the processor circuit 310 rushes the transition to the connected mode. When the power grid is providing power and the backup source 325 is requesting a discharge below a specified threshold, then the processor circuit 310 may delay the transition to the connected mode until the power of the backup source 325 falls below the specified threshold. In some embodiments, whenever the processor circuit 310 detects that the power grid is providing power, then the processor circuit 310 may transition to the connected mode immediately, regardless of conditions of the power from the power grid as compared those of the backup source power. In some embodiments, the processor circuit 310 monitors the power grid and the building circuit before closing the relay 317 to ensure that the power grid power and the building circuit power (for example, from the backup source) are of the same or similar quality. For example, the processor circuit 310 may compare the power from the power grid and the power from the backup source and only close the relay 317 when the conditions of the power on opposite sides of the relay 317 match or substantially match.

When closing the relay 317, the processor circuit 310 may communicate a signal or command to the relay driver 315 to close the relay 317. When opening the relay 317, the processor circuit 310 may communicate a signal or command to the relay driver 315 to open the relay 317. In some embodiments, processor circuit 310 may store the communicated signal or command in a data store or memory track a state of the relay 317 at given times. Thus, the processor circuit 310 controls opening and closing the relay 317 via the relay driver 315 based on an analysis of the inputs from the power grid, the backup source, and the building circuit and stores a history of the mode in which the interrupting switch system 110 operates at given moments or times.

The Wi-Fi module 330 enables the processor circuit 310 and, thus, the interrupting switch system 110, to communicate with other devices in or supporting the building. For example, the Wi-Fi module 330 may enable the interrupting switch system 110 to wirelessly communicate with the other devices, thereby eliminating a need for any electrical connections between the interrupting switch system 110 and the backup source or the building system aside from the bus bars 167a-167b. The Wi-Fi module 330 may communicate via any wireless communication standard, for example one or more IEEE 802.11 standard. In some embodiments, the Wi-Fi module 330 may incorporate additional power components, such as an independent battery, that facilitates communication independent of any power status/inputs of other components of the interrupting switch system 110.

The RS-485 module 335 enables the processor circuit 310 and, thus, the interrupting switch system 110, to communicate with other devices in or supporting the building. For example, the RS-485 module 335 may enable the interrupting switch system 110 to communicate with the other devices according to the RS-485 standard via a wired medium. The RS-485 standard may be commonly used in serial communications and may often be seen in electrically noisy environment.

The CAN bus module 340 enables the processor circuit 310 and, thus, the interrupting switch system 110, to communicate with other devices in or supporting the building. For example, the CAN bus module 340 may enable the interrupting switch system 110 to communicate with the other devices via a wired CAN bus medium. The CAN bus medium may often be used in automobiles, automation, and similar environments and allow message-based communications between nodes or devices in the network. The CAN bus module 340 is a multi-master serial bus standard that may promote fault tolerate communications and that operates well in electrically noisy environments, for example, areas in close proximity to the connection 201 to the power grid and the circuit breaker panel 210.

In some embodiments, the CAN bus module 340 and/or the RS-485 module 335 are connected to the backup source and/or the building circuit via the connector 350. For example, the connector 350 may comprise a 6-pin connector that provides a 12V connection, a ground connection, and a pair of connections for each of the CAN bus module 340 and the RS-485 module 335. In some embodiments, the connector 350 provides more than six pins, for example, seven, eight, ten, twelve, and so forth pins.

The PLC modem 345 may enable communications from the interrupting switch system 110 to downstream components (or even upstream components, in some circumstances) via the power lines. For example, the PLC modem 345 may communicate via the bus bars 167a-167b to the building circuit or other downstream devices connected to the power lines downstream of the power meter socket 205 or the bus bars 166a-166b to the power meter 105 and, potentially, the power grid upstream of the power meter socket 205. By using the PLC modem 345, the interrupting switch system 110 may communicate with other devices connected to the building circuit without requiring additional conductors for wired communications. As previously discussion, one or more fans 360 may be connected to the MCU 310 to facilitate heat dissipation functionality.

Figure 4:
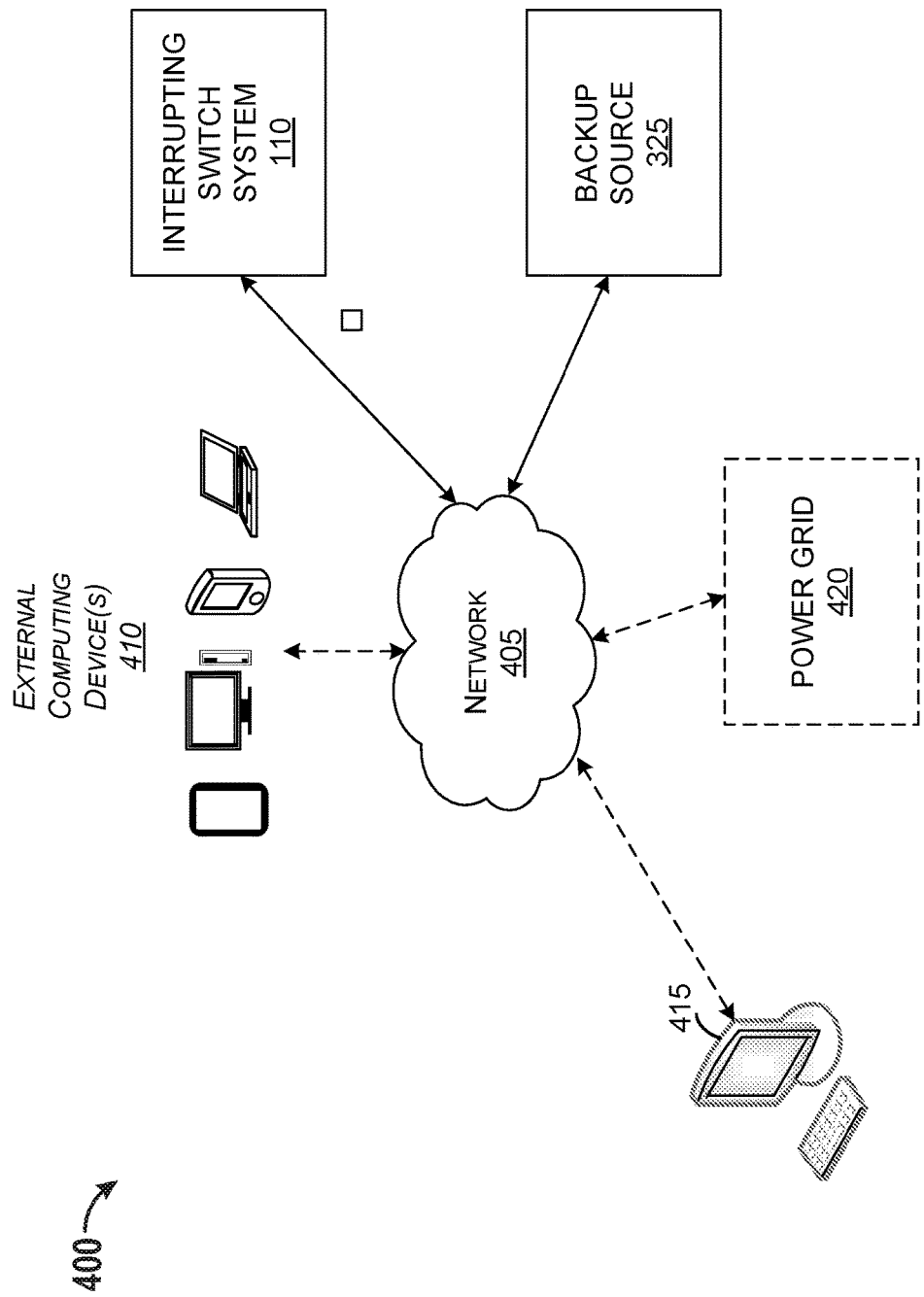
FIG. 4 is an example network diagram of network that enables communications between the interrupt switch system and other components of the building circuit.

The interrupting switch system 110, as described above, communicates with the building circuit and the backup source 325. FIG. 4 is an example network diagram 400 of a network 400 that enables communications between the interrupt switch system 110 and other components of the building circuit. The network 405 may comprise any one of a Wi-Fi network, an RS-485 network over which the RS-485 module 330 communicates, a CAN bus network over which the CAN bus module 335 communicates, or a PLC network over which the PLC module 345 communicates. The network diagram shows the network 400 connecting the interrupting switch system 110 to the backup source 325. This connection, as described further herein, enables the interrupting switch system 110 to inform the backup source 325 of a transition to the isolated mode from the connected mode. Similarly, this connection enables the interrupting switch system 110 to communicate to the backup source 325 when the interrupting switch system 110 is ready to switch from the isolated mode to the connected mode. When the interrupting switch system 110 is instructing to switch from the isolated mode to the connected mode, the interrupting switch system 110 may also communicate parameters of the power provided by the power grid. For example, the interrupting switch system 110 may indicate to the backup source the parameters or condition of the power of the power grid when preparing to transition to the connected mode. Additionally, the interrupting switch system 110 may receive communications from the backup source 325, for example indicating that the backup source 325 is active and ready to provide power to the building circuit during the isolation mode. In some embodiments, the interrupting switch system 110 may communicate information regarding status of one or more of the interrupting switch system 110 (for example, whether in the isolated mode or the connected mode), the backup source 325 (for example, whether the backup source 325 is operational in the isolated mode, is ready to provide power, and so forth), and the power grid (for example, whether it is providing power, and so forth) to one or more of external computing device 410, a controller 415, and the power grid 420. In some embodiments, the external computing device(s) 410 comprises a user device of an entity associated with the building (for example, a resident, tenant, and so forth). The external computing device 410 may allow the user to monitor conditions of the interrupting switch system 110, the backup source 325, and the power grid 420. In some embodiments, the user can further control one or more of the interrupting switch system 110 and the backup source 325 via the external computing device(s) 410. The controller 415 may comprise a controller or similar component of the building circuit. For example, the controller 415 may comprise a gateway or similar component through which one or more components of the building circuit can be monitored, managed, or manipulated by the external computing devices 410. Additionally, or alternatively, the controller 415, the interrupting switch system 110, and/or the backup source 325 may communicate directly or indirectly to convey conditions of the interrupting switch system 110, the backup source 325, and/or the building circuit to each other. For example, the controller 415 may convey an expected change in demand to the backup source 325 and/or the interrupting switch system 110 to control when the interrupting switch system 110 switches modes (for example, to ensure that sufficient power is available to meet a change in load or an ability to disconnect from the power grid when demand is low enough. In some embodiments, the power grid 420 represents the utility power grid, and communications to the power grid 420 can be about condition of the power or status of power delivery, among others.

Figure 5:
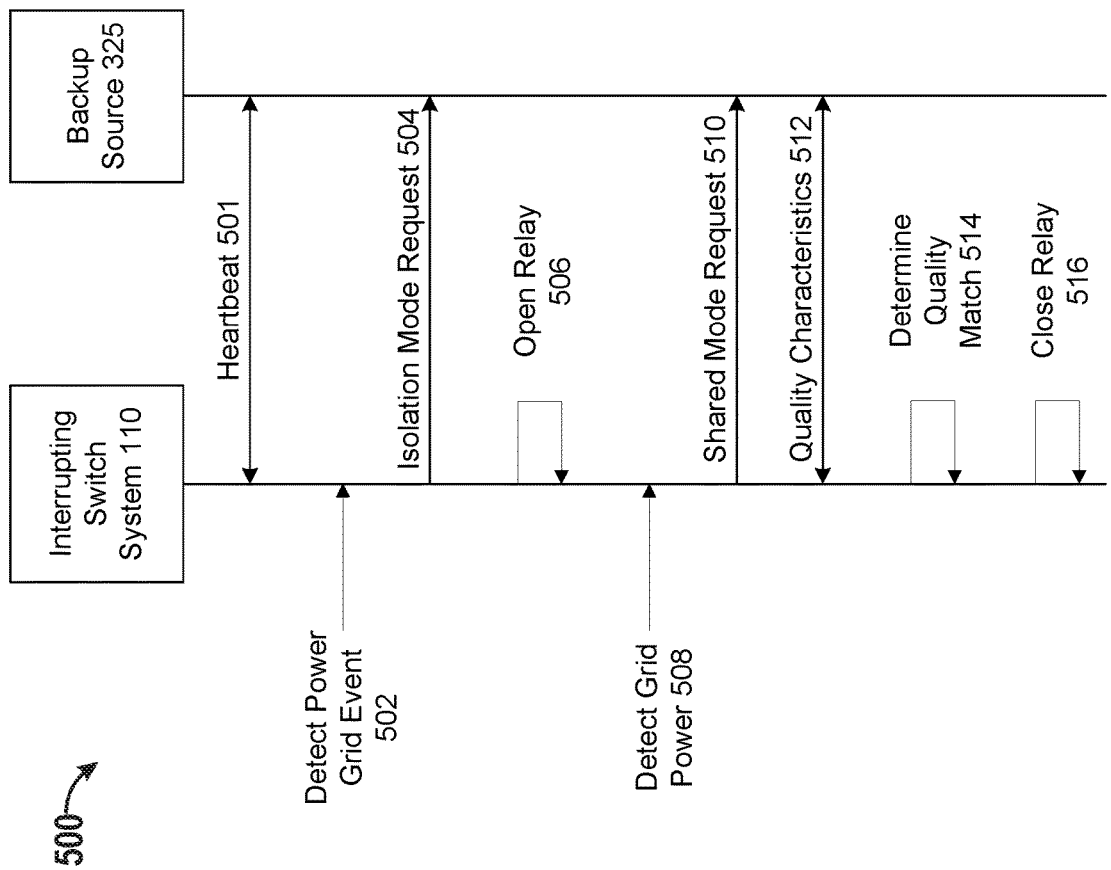
FIG. 5 is a flow diagram showing example interactions between the interrupt switch system and other components of the building circuit.

As described above, the network 400 may enable the communications and interactions between the interrupt switch system 110, the building circuit, and the backup source 325. FIG. 5 is a flow diagram 500 showing example interactions between the interrupt switch system 110 and other components of the building circuit. The flow diagram includes interactions or communications between the interrupting switch system 110 and the backup source 325. These communications may occur via one of the communication modules described herein (for example, the Wi-Fi module 330, RS-485 module 335, the CAN bus module 340, and the PLC modem 345). In some embodiments, the communications described below can occur between one or more other intermediate components, though not shown as such here.

The interrupting switch system 110 and the backup source 325 (and any other component of the network 400) may maintain a heartbeat 501 to ensure communications between the components are consistent and continuous. As described above, the interrupting switch system 110 detects, at 502, that the power grid is experiencing a disruption and/or not providing power to the building. The detection is based on the lack of an induced voltage induced in response to a current through the bus bars 165a-165b or a communication with the power grid or any similar manner. Based on this detection, the interrupting switch system 110 may send an isolation mode request to the backup source 325 at 504. In some embodiments, the communication at 504 may be via one or more of the Wi-Fi module 330, the RS-485 module 335, the CAN bus module 340, and the PLC modem 345. Based on the isolation mode request 504, though not shown in FIG. 5, the backup source 325 may begin to provide power to the building circuit if the backup source was not previously providing power or continue providing power if already providing power. Once the backup source 325 receives the isolation mode request at 504, the backup source 325 may begin providing power to the building circuit.

At 506, the interrupting switch system 110 may open the relay 317 via the relay driver 315, thereby interrupting the connection between the power meter and the building circuit and enabling the isolation mode. After opening the relay 317, the interrupting switch system 110 may determine that the power grid 420 is again providing power at 508. This may be based on detection of the induced voltage at the energy meter 305 based on the sense coils 307a-307b or a communication from the power grid or another means, as described above. In response, the interrupting switch system 110 may communicate a connected mode request 510 to the backup source 325 at 510. As described above, this communication may be direct or indirect through another component via one or more of the Wi-Fi module 330, the RS-485 module 335, the CAN bus module 340, and the PLC modem 345. In some embodiments, following the connected mode request 510, the interrupting switch system 110 and the backup source 325 may exchange data to define the quality characteristics of the power grid power and the backup source power. The interrupting switch system 110 may measure the quality characteristics of the power grid power and the backup source power and communicate differences to the backup source 325 requesting that it adjust its power to match or substantially match the power grid power. At 514, the interrupting switch system 110 may determine whether the qualities match. In some embodiments, the energy meter 305 may sense components on the line side of the relay 317 (i.e., the bus bars 165a-165b and/or bus bar 166a-166b of the power meter 105) and separate sensing components on the load side of the relay 317 (i.e., the bus bar 167a-167b to the power meter socket 305). Once the interrupting switch system 110 determines that the qualities match and that the power grid 420 is still providing power, the interrupting switch system 110 may close the relay 317 via the relay driver 315. As such, the power grid 420 and/or the backup source 325 may provide power to the building circuit.

Each of the processes, methods, and algorithms described in the preceding sections may be embodied in, and fully or partially automated by, code modules executed by one or more computer systems or computer processors comprising computer hardware. The code modules may be stored on any type of non-transitory computer-readable medium or computer storage device, such as hard drives, solid state memory, optical disc, and/or the like. The systems and modules may also be transmitted as generated data signals (for example, as part of a carrier wave or other analog or digital propagated signal) on a variety of computer-readable transmission mediums, including wireless-based and wired/cable-based mediums, and may take a variety of forms (for example, as part of a single or multiplexed analog signal, or as multiple discrete digital packets or frames). The processes and algorithms may be implemented partially or wholly in application-specific circuitry. The results of the disclosed processes and process steps may be stored, persistently or otherwise, in any type of non-transitory computer storage such as, for example, volatile or non-volatile storage.

Those of skill will recognize that the various illustrative logical blocks, modules, circuits, and algorithm steps described as follows, and in connection with the embodiments disclosed herein may be implemented as electronic hardware, software stored on a computer readable medium and executable by a hardware processor, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor reads information from, and write information to, the storage medium. In the alternative, the storage medium may be integral to the processor. The processor and the storage medium may reside in an ASIC.

While the above detailed description has shown, described, and pointed out novel features of the development as applied to various embodiments, it will be understood that various omissions, substitutions, and changes in the form and details of the device or process illustrated may be made by those skilled in the art without departing from the spirit of the development. As will be recognized, the present development may be embodied within a form that does not provide all of the features and benefits set forth herein, as some features may be used or practiced separately from others. All changes which come within the meaning and range of equivalency of the claims are to be embraced within their scope.

A person skilled in the art will recognize that each of these sub-systems may be inter-connected and controllably connected using a variety of techniques and hardware and that the present disclosure is not limited to any specific method of connection or connection hardware.

The technology is operational with numerous other general purpose or special purpose computing system environments or configurations. Examples of well-known computing systems, environments, and/or configurations that may be suitable for use with the invention include, but are not limited to, personal computers, server computers, hand-held or laptop devices, multiprocessor systems, microprocessor-based systems, a microcontroller or microcontroller based system, programmable consumer electronics, network PCs, minicomputers, mainframe computers, distributed computing environments that include any of the above systems or devices, and the like.

As used herein, instructions refer to computer-implemented steps for processing information in the system. Instructions may be implemented in software, firmware or hardware and include any type of programmed step undertaken by components of the system.

A microprocessor may be any conventional general purpose single- or multi-chip microprocessor such as a Pentium® processor, a Pentium® Pro processor, a 8051 processor, a MIPS® processor, a Power PC® processor, or an Alpha® processor. In addition, the microprocessor may be any conventional special purpose microprocessor such as a digital signal processor or a graphics processor. The microprocessor typically has conventional address lines, conventional data lines, and one or more conventional control lines.

The system may be used in connection with various operating systems such as Linux®, UNIX®, MacOS® or Microsoft Windows®.

The system control may be written in any conventional programming language such as C, C++, BASIC, Pascal, .NET (e.g., C#), or Java, and ran under a conventional operating system. C, C++, BASIC, Pascal, Java, and FORTRAN are industry standard programming languages for which many commercial compilers may be used to create executable code. The system control may also be written using interpreted languages such as Perl, Python or Ruby. Other languages may also be used such as PHP, JavaScript, and the like.

The foregoing description details certain embodiments of the systems, devices, and methods disclosed herein. It will be appreciated, however, that no matter how detailed the foregoing appears in text, the systems, devices, and methods may be practiced in many ways. As is also stated above, it should be noted that the use of particular terminology when describing certain features or aspects of the invention should not be taken to imply that the terminology is being re-defined herein to be restricted to including any specific characteristics of the features or aspects of the technology with which that terminology is associated.

It will be appreciated by those skilled in the art that various modifications and changes may be made without departing from the scope of the described technology. Such modifications and changes are intended to fall within the scope of the embodiments. It will also be appreciated by those of skill in the art that parts included in one embodiment are interchangeable with other embodiments; one or more parts from a depicted embodiment may be included with other depicted embodiments in any combination. For example, any of the various components described herein and/or depicted in the Figures may be combined, interchanged or excluded from other embodiments.

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present development. This development is susceptible to modifications in the methods and materials, as well as alterations in the fabrication methods and equipment. Such modifications will become apparent to those skilled in the art from a consideration of this disclosure or practice of the development disclosed herein. Consequently, it is not intended that this development be limited to the specific embodiments disclosed herein, but that it cover all modifications and alternatives coming within the true scope and spirit of the development as embodied in the attached claims.

As will be understood by those of skill in the art, in some embodiments, the processes set forth in the following material may be performed on a computer network. The computer network having a central server, the central server having a processor, data storage, such as databases and memories, and communications features to allow wired or wireless communication with various parts of the networks, including terminals and any other desired network access point or means.

What is claimed is:

1. An interrupt switch system, comprising:
    a housing configured to mate with an electric meter socket on a first side and an electric meter on a second side, the housing comprising power inputs from grid power and power outputs to a circuit breaker panel; and
    an interrupt circuit disposed within the housing and configured to interrupt a flow of electricity from the power inputs to the power outputs,
    wherein the interrupt circuit comprises a relay switch configured to create an open circuit or a closed circuit between the power inputs and the power outputs, wherein the relay switch is controllable by one of a processor circuit and a manual disconnect switch,
    wherein the housing further comprises:
        a first conductor pair configured to electrically couple input terminals of the electric meter to respective terminals in the electric meter socket;
        a second conductor pair configured to electrically couple output terminals of the electric meter to the interrupt circuit; and
        a third conductor pair configured to couple the interrupt circuit to respective terminals in the electric meter socket electrically coupled to the circuit breaker panel,
    and wherein the first conductor pair, the second conductor pair, and the third conductor pair are at least partially disposed within the housing.

2. The system of claim 1, further comprising a communication circuit in data communication with the interrupt circuit and configured to communicate one or more of a heartbeat signal and a state of the grid power to an external component.

3. The system of claim 2, wherein the external component is a power backup system configured to provide power to the circuit breaker panel in a backup event.

4. The system of claim 3, wherein the power backup system is one of a battery backup device and a solar power array.

5. The system of claim 2, further comprising:
    a sense circuit configured to sense power flow into the electric meter; and
    a processor circuit configured determine the state of the grid power based on the sensed power flow.

6. The system of claim 5, wherein the sense circuit comprises at least one Rogowski coil configured to sense power flow through a bus bar pair that feeds the grid power to the electric meter.

7. The system of claim 1, wherein the housing is an ANSI 2S compliant adapter configured to receive the electric meter that is ANSI 2S compliant on the second side and mate with the electric meter socket that is ANSI 2S compliant on the first side.

8. The system of claim 1, wherein the housing comprises the manual disconnect switch which is configured to interrupt the flow of electricity from the power inputs to the power outputs when the manual disconnect switch is actuated.

9. A method of isolating a circuit breaker panel for a building from a grid circuit during an event disrupting the grid circuit, the method comprising:
    sensing a current in the grid circuit;
    transitioning to backup power based on detecting a disruption in the grid circuit, the transitioning comprising:
        disconnecting output terminals of an electric meter for the building from terminals of an electric meter socket via which the circuit breaker panel receives electricity from the grid circuit using an interrupt switch adapter, wherein the interrupt switch adapter is installed into the electric meter socket and the electric meter is installed into the interrupt switch adapter, wherein the interrupt switch adapter comprises a relay switch configured to create an open circuit or a closed circuit, wherein the relay switch is controllable by one of a processor circuit and a manual disconnect switch, wherein the interrupt switch adapter comprises:
 a first conductor pair configured to electrically couple input terminals of the electric meter to the terminals of the electric meter socket;
 a second conductor pair configured to electrically couple the output terminals of the electric meter to an interrupt circuit included in the interrupt circuit adapter; and
 a third conductor pair configured to couple the interrupt circuit to respective terminals of the electric meter socket which are electrically coupled to the circuit breaker panel,
 and wherein the first conductor pair, the second conductor pair, and the third conductor pair are at least partially disposed within the interrupt switch adapter, and
 activating a backup power source to energize at least a portion of the circuit breaker panel during the disruption in the grid circuit.

10. The method of claim 9, wherein sensing the current in the grid circuit comprises sensing the current in the grid circuit with at least one Rogowski coil without physically contacting the grid circuit and without establishing communications with the grid circuit.

11. The method of claim 9, further comprising:
continuously monitoring the grid circuit for an end of the disruption; and
connecting the circuit breaker panel to the grid circuit when a first power quality of the grid circuit matches a second power quality of the backup power source.

12. The method of claim 11, further comprising:
detecting the end of the disruption;
detecting a parameter of the first power quality;
detecting a parameter of the second power quality;
communicating the parameter of the first power quality to the backup power source; and
determining that the parameter of the first power quality matches the parameter of the second power quality before connecting the grid circuit to the circuit breaker panel.

13. The method of claim 9, further comprising detecting that the grid circuit is experiencing the disruption based on sensing the current in the grid circuit.

14. The method of claim 9, wherein transitioning to backup power further comprises confirming that the backup power source is available to provide power to at least the portion of the circuit breaker panel and maintaining a heartbeat with the backup power source.

15. A power disconnect system, comprising:
a power backup system;
at least one external device, wherein the at least one external device comprises an external computing device, a controller, or a power grid; and
an interrupt switch, the interrupt switch comprising:
 a housing configured to mate with an electric meter socket on a first side and an electric meter on a second side, the housing comprising power inputs from grid power and power outputs to a circuit breaker panel; and
an interrupt circuit disposed within the housing and configured to interrupt a flow of electricity from the power inputs to the power outputs,
wherein the interrupt circuit comprises a relay switch configured to create an open circuit or a closed circuit between the power inputs and the power outputs, wherein the relay switch is controllable by one of a processor circuit and a manual disconnect switch,
wherein the housing further comprises:
 a first conductor pair configured to electrically couple input terminals of the electric meter to respective terminals in the electric meter socket;
 a second conductor pair configured to electrically couple output terminals of the electric meter to the interrupt circuit; and
 a third conductor pair configured to couple the interrupt circuit to respective terminals in the electric meter socket electrically coupled to the circuit breaker panel,
 and wherein the first conductor pair, the second conductor pair, and the third conductor pair are at least partially disposed within the housing;
wherein the power backup system, the interrupt switch, and the at least one external device communicate via a network.

16. The system of claim 15, wherein the at least one external device is a controller, wherein the controller is configured to control one or more components of a building circuit.

17. The system of claim 15, wherein the at least one external device is an external computing device, wherein the external computing device is configured to control the power backup system or the interrupt switch.

* * * * *